(12) United States Patent
Leyendecker et al.

(10) Patent No.: US 6,352,627 B2
(45) Date of Patent: *Mar. 5, 2002

(54) METHOD AND DEVICE FOR PVD COATING

(75) Inventors: Antonius Leyendecker, Herzogenrath; Georg Erkens; Stefan Esser, both of Aachen; Hans-Gerd Fuss, Herzogenrath; Bernd Hermeler; Rainer Wenke, both of Aachen, all of (DE)

(73) Assignee: Cemecon-Ceramic Metal Coatings (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/402,961

(22) PCT Filed: Apr. 9, 1998

(86) PCT No.: PCT/EP98/02100

§ 371 Date: Oct. 14, 1999

§ 102(e) Date: Oct. 14, 1999

(87) PCT Pub. No.: WO98/46807

PCT Pub. Date: Oct. 22, 1998

(30) Foreign Application Priority Data

Apr. 14, 1997 (DE) .......................... 197 15 535
Dec. 10, 1997 (DE) .......................... 197 54 821

(51) Int. Cl.$^7$ ............................................. C23C 14/34
(52) U.S. Cl. .......................... 204/298.08; 204/298.03; 204/298.06; 204/298.14
(58) Field of Search ................. 204/298.03, 298.06, 204/298.08, 298.14, 192.12, 192.13

(56) References Cited

U.S. PATENT DOCUMENTS

| 3,410,775 | A | * | 11/1968 | Vratny | 204/298.06 |
|---|---|---|---|---|---|
| 4,871,434 | A | * | 10/1989 | Munz et al. | 204/298.06 |
| 4,988,422 | A | * | 1/1991 | Wirz | 204/298.06 |
| 4,997,539 | A | * | 3/1991 | Komizo et al. | 204/298.06 |
| 5,000,834 | A | * | 3/1991 | Yoshikawa | 204/298.08 |
| 5,234,560 | A | * | 8/1993 | Kadlec et al. | 204/192.12 |

FOREIGN PATENT DOCUMENTS

| DE | 36 11 492 A1 | 10/1987 |
|---|---|---|
| EP | 0 558 061 A | 9/1993 |
| EP | 0 677 595 A | 10/1995 |
| WO | 91 00374 | 1/1991 |

\* cited by examiner

Primary Examiner—Rodney G. McDonald
(74) Attorney, Agent, or Firm—Banner & Witcoff, Ltd.

(57) ABSTRACT

The invention relates to a PVD coating method and to a PVD coating device with a chamber in which at least one target cathode, at least one anode and at least one substrate holder which is intended to hold at least one substrate are arranged, and with a control device which delivers a first voltage in order to supply the target cathode with a negative electrical potential relative to the anode in order to form a plasma in which the substrate is arranged, and which delivers a second voltage in order to supply the anode with a positive electrical potential relative to the chamber wall. In this sputter-coating device, the ion fraction of the target material which can be achieved is too low for qualitatively satisfactory coating properties. It is increased according to the invention in that the control device delivers a third voltage which supplies the substrate with an electrical potential that is more negative than the potential of the anode.

7 Claims, 3 Drawing Sheets

METHOD AND DEVICE FOR PVD COATING

The present invention relates to a PVD coating device with an evacuable chamber, which is equipped with at least one gas feed connection and in which at least one target cathode, which is exposed to a sputtering process, at least one anode and at least one substrate holder which is intended to hold at least one substrate and is electrically connected to each substrate which is put in it, are arranged, and with a control device having a first voltage output connected to deliver a first voltage in order to supply the target cathode with a negative electrical potential relative to the anode in order to form a plasma in which the substrate is arranged, and having a second voltage output connected to deliver a second voltage in order to supply the anode with a positive electrical potential relative to the chamber wall, as well as to a PVD coating method for producing a coated substrate. Such a PVD coating device is known from EP 0 434 797.

Generally, known PVD coating devices are used to provide all kinds of tools and components with coatings in order to give the surface a functional and possibly also decorative configuration. In the case of tools, these are predominantly coatings using metal-containing components, for example TiAlN.

One known technique for the production of coatings is the deposition of condensates from the gas phase. Numerous devices are used for this, each of which is optimized for particular methods. Devices in which the coating is made up of a high proportion of ionized atoms from a plasma are particularly advantageous for forming the coating.

In coating devices with which a high proportion of metal ions is produced in the plasma, a metallic material is regularly evaporated from the target cathode, and high proportions of the evaporated material are ionized. In devices of this type, the target cathode material is firstly melted before it enters the gas phase. The degree of ionization of the evaporated material is high.

However, in known devices of this type, in which the target cathode material passes through a molten phase, the disadvantage is found that, during the evaporation of alloys in the gas phase, droplets are formed and the gas phase is not homogeneous. Accordingly, the condensed coatings contain so-called droplets and/or the composition of the coating is rendered inhomogeneous.

Other known coating devices are configured in such a way that, in order to evaporate the target cathode material, cathodic sputtering takes place, with a magnetron old being used to increase the ionization efficiency. In this case, the material is converted directly from the solid state into the vapour state, without it being in the molten state in between.

However, cathodic sputtering devices have the disadvantage that the evaporated material is only weakly ionized. The plasma consists predominantly of evaporated neutral particles (degree of ionization about 5%) and other ionized gas particles which originate from working gases for ejecting target atoms and ions and for producing the plasma, or from reactive gases which bond with the target cathode materials. In the case of rough technical surfaces, in particular ket abraded or ground ones, the coatings deposited from these plasmas have disadvantages in terms of their properties of adhesion, hardness, structure and surface topography (smoothness and colour). In the case of such substrate surfaces, it has to date not been possible to produce a so-called dimpled surface coating which is distinguished by a dense, compact structure with smooth surface.

WO 91/00374 discloses a process and a device for coating substrates, in which both arc discharge volatilization and cathodic evaporation are used, the arc discharge volatilization being carried out before the cathodic evaporation. The ciruitry according to the WO 91/00374 includes a voltage source connected between a cathode and a chamber wall, a voltage source connected between the cathode and an anode and a voltage source for supplying a substrate with a bias voltage. An almost identical device is disclosed in the EP 0 558 061 A1.

The EP 0 677 595 A1 discloses a device for an arc discharge volatilization only. The device includes a single voltage supply, in which the cathode is connected continuously to the voltage supply, while optionally the anode or the substrate are connected to the remaining pole of the voltage supply.

On the basis of this prior art, the object of the invention is to further develop a PVD coating device of the generic type in such a way that the material of the target cathode evaporates from the solid phase without a molten phase, and, this being the case, a high proportion of the material condenses with good adhesion on the substrate, it also being possible for the substrate to be provided with a rough, in particular ground or jet abraded, technical surface.

This object is achieved in the case of a device of generic type in that the control device has a third voltage output connected to deliver a third voltage which supplies the substrate with an electrical potential that is more negative than the potential of the anode.

The effect achieved by this is that, inside the chamber and during operation of the PVD coating device, a further electrode, namely the substrate, is provided in the plasma with a defined potential, this electrode being arranged inside the plasma and ensuring an advantageous potential profile in the chamber. In particular, the second voltage, namely he anode voltage, makes it possible to set the current flowing at the substrate, while the third voltage, namely the substrate or bias voltage, can remain constant. The coating conditions on the substrate can thus be optimized particularly simply.

This electrical connection scheme also has a decisive effect on the electron density distribution in the chamber. The fact that the potential of the substrate is more negative than the potential of the anode achieves the effect that the trajectories of the electrons extend predominantly either, in order to sustain the plasma, from the target cathode to the anode or, to enhance the ionization of the metal atoms ejected from the target cathode, from the target cathode to the substrate. The enhanced ionization results from the transport path of the metal atoms from the target cathode to the substrate coinciding with the latter portion of the electron trajectories.

By virtue of the potential profile set up according to the invention in the chamber, an ionization efficiency of up to 50% can be achieved for the ejected target metal atoms. As a consequence of this, using this coating device in a sputtering method, a degree of ionization will be achieved which is suitable for depositing layers with a dimpled surface on the substrate, even if the substrate surfaces are rough, for example because of a grinding or jet abrasion treatment. A power density of up to 45 W/cm$^2$ can be achieved at the target cathode, and the discharge current is increased considerably in comparison with the prior art.

The potential profile in the chamber also has the further result that the potential of the plasma ignited between the target cathode and the anode in the region of the substrate is fundamentally more positive than the substrate potential. The effect of this is that, for example, ions originating from the plasma in this region of the chamber are transported with a high probability in the direction of the substrate and can be deposited there.

Electrons are furthermore prevented from reaching the chamber wall and therefore being ineffective for ionizing these metal atoms. For this purpose, the substrate preferably has the same potential as the target cathode, or is biased positively relative to the target cathode, so that electrons are drawn in the direction of the substrate in order to ionize the target material. It is, however, also possible for the potential of the target cathode to be more positive than the potential of the substrate.

It is also possible to provide a plurality of anodes and target cathodes which are arranged symmetrically in such a way that the substrate lies in the plasma during the coating process.

The substrates are, for example, cutting tools which are to be provided with a coating of hard substance.

Preferably, the second and third voltages are set in such a way that the positive electrical potential of the anode with respect to the chamber wall is less than the positive electrical potential of the anode with respect to the substrate, and in that the substrate is arranged in the vicinity of the target cathode.

In this embodiment of the invention, the optimization of the electron density distribution in the chamber before the target cathode is achieved particularly efficiently. By virtue of the negative bias voltage of the substrate with respect to the anode and the proximity of the substrate to the target cathode, the proportion of electron trajectories leading to the substrate is further increased, and the ionization of the metal atoms from the target cathode is therefore improved.

Preferably, the first, second and third voltages are set in such a way as to set a floating potential which, when the plasma is ignited between the target cathode and the anode in the region of the substrate, is about 40 volts to about 400 volts, preferably 130 volts, higher than the potential of the substrate.

This ensures that ions originating from the plasma in the region of the substrate pass very predominantly in the direction of the substrate and, on the substrate, can be deposited in order to form a coating. The losses of ions resulting from their recombination on the chamber wall are therefore minimized.

In a preferred embodiment, the first voltage is set in such a way that the anode is at a potential which is up to about 800 volts higher than the potential of the target cathode. The second voltage may be set in such a way that the anode is at a potential which is between about 50 volts and up to 250 volts more positive than the potential of the chamber wall, while the third voltage is preferably set in such a way that the anode is at a potential which is up to 800 volts, in particular 100 volts to 200 volts, more positive than the potential of the substrate.

These value ranges for the potential differences between the anode, target cathode, chamber wall and substrate have been found experimentally to be particularly favourable. When setting the potentials, in particular the potential between the anode and the cathode, the respective properties of the target materials should be taken into account, in particular including their magnetic properties.

The ratio of the distance between the target cathode and the substrate to the distance between the target cathode and the anode is preferably about 1:5.

This distance ratio leads to a geometry for the electrodes, target cathode, substrate, chamber wall and anode, which is distinguished by a particularly favourable profile of the equipotential lines which determine the trajectories of the charge carriers and, in particular, the electron density distribution.

The substrate holder may, for example, be arranged in such a way that the substrate is arranged approximately at a distance of 40 mm from the target cathode, and the distance between the target: cathode and the anode is in the region of 250 mm.

A particularly compact structure of the PVD coating system is achieved in this way. In particular, the short distance from the target cathode to the substrate leads to very high coating rates for coating the substrate. This results in economically favourable production of the coating by virtue of high-speed production.

Preferably, the control device has a voltage source assigned to each of the three voltages, the first voltage source being connected between the anode and the target cathode, the second voltage source being connected between the anode and the chamber wall and the third voltage source being connected between the anode and the substrate. Using the second voltage source, the current at the substrate is in this case set by acting on the plasma, while by retaing the setting of the third voltage source, the potential difference between the substrate and the anode will be maintained even if the setting of the second voltage source and therefore the substrate current is altered.

In this case it is also ensured that any possible fluctuations in the anode potential do not have repercussions on the voltage differences between the anode and the target cathode, and between the anode and the substrate, so that more stable operation of the PVD coating device is achieved.

It is, however, also possible for all three voltage sources to have one of their poles on the chamber wall.

As an alternative to the embodiment with three voltage sources, it is possible for the control device to have only one voltage source, which delivers the first voltage between the anode and the target cathode, and to have, for the second and third voltages, a respective variable resistor which is connected in parallel with the voltage source. The variable resistors are set in such a way that the required potentials for the anode and the substrate are present on their respective taps.

All the same, irrespective of the manner of electrical connection, what is essential to the invention is that the above described potential profile in the chamber is maintained.

The abovementioned object is likewise achieved by a PVD coating method for producing a coated substrate, comprising the following steps:

arranging at least one target cathode, which is exposed to a sputtering process, at least one anode and the substrate, which is arranged on a substrate holder which is electrically connected to the substrate, in an evacuable chamber;

filling the chamber with a working gas and/or a reactive gas through at least one gas feed connection;

applying a first voltage in order to supply the target cathode with a negative electrical potential relative to the anode in order to form a plasma in which the substrate is arranged;

applying a second voltage in order to supply the anode with a positive electrical potential with respect to the chamber wall;

applying a third voltage which supplies the substrate with an electrical potential more negative than or equal to that of the anode; and removing the substrate from the chamber after a predetermined coating time.

The essential step in this production method for a coated substrate consists in the procedural step of applying the third voltage, as described above. This procedural step considerably increases the electron density before the target cathode, and is therefore decisive for the improved quality and faster production of the coating in comparison with the prior art. The method can advantageously be developed further by employing the above-described features of the coating device.

Preferred embodiments of the invention will be described by way of example in further detail below with reference to the drawings, in which.

Figure 1:
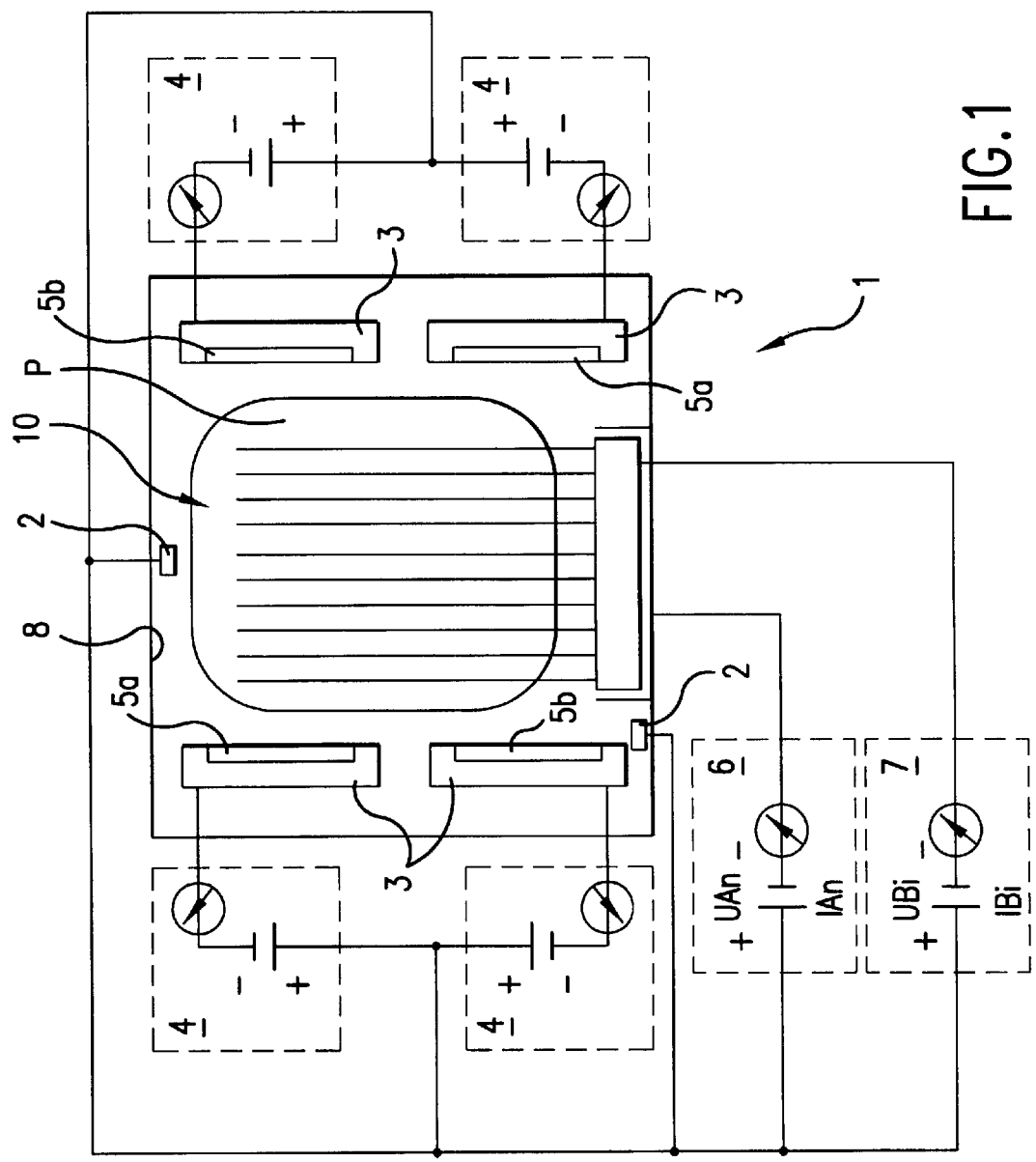
FIG. 1 shows a schematic circuit diagram of an electrical supply of a PVD coating device.

FIG. 1 represents a schematic circuit diagram which illustrates an electrical supply of a PVD coating device. The PVD coating device according to the embodiment which is represented has a coating chamber 1. During a coating process, a working gas mixture is fed into this chamber 1 through a gas connection (not shown).

The working gas may be a noble gas, for example argon.

Furthermore, reactive gases are fed into the chamber 1 through a gas connection (not shown), it being possible for these to be nitrogen, carbon-containing gases such as $CH_4$, $C_2H_2$ or $C_2H_8$, which can be used to form nitrides, carbides and carbonitrides.

At the start of a coating process, a plasma (P) is ignited within an atmosphere of a working gas/reactive gas mixture. For this purpose, the coating device has two anodes 2 and four target cathodes 3, the target cathodes 3 being arranged in pairs opposite one another and the anodes 2 being arranged, essentially opposite one another, laterally with respect to an intermediate space between the mutually opposite target cathodes 3.

In the illustrative embodiment which is represented, the anodes 2 are high-ionization anodes according to European Patent No. 0 434 797. In order to match their anode area effective for the ionization process to the target cathode power which is set, the anodes are partially covered by a diaphragm, the diaphragm being designed to conduct electricity. The diaphragm has the same electrical potential as the chamber wall 8. These anodes 2 are particularly favourable for high ionization of the plasma (P). Basically, however, it is sufficient to have an anode configuration in which an active anode area is defined.

The target cathodes are preferably so-called unbalanced magnetrons.

The anodes 2 are biased positively with respect to the target cathodes 3. For this purpose, each of the target cathodes 3 is respectively connected to a cathode voltage source 4. The voltage sources 4 each deliver a first voltage $U_X$ with a value of about 500 volts. This value is kept throughout the coating process, that is to say after the plasma (P) has been ignited.

After the plasma (P) has been ignited, there is a plasma cloud in the chamber 1, which amongst other things contains working gas ions. These working gas ions are accelerated in the direction of the target cathodes 3 by the electric field applied between the anodes 2 and the target cathodes 3, in particular as a result of the potential gradient between the plasma cloud and the target cathodes 3.

The target cathodes 3 bear target material 5, and in the example which is represented they are titanium/aluminium mixed targets 5a, 5b. It is, however, also possible to use targets- which contain copper, platinum, chromium, nickel or other metals, as well as nonconductors such as ceramic materials, in the case of which it is necessary to have an alternating electric field in order to sustain the plasma (P).

This target material 5 is exposed to bombardment with working gas ions, that is to say a sputtering process, which has the effect that the target material 5 leaves the target cathodes 3 in atomic or ionized form. In this case, directly after leaving the target cathodes 3, the proportion of the target material which is ionized amounts to about 5%.

With a low ion fraction of this type, it is not possible to achieve a coating structure which is distinguished by high density and compactness with a smooth surface structure.

In order to increase the degree of ionization, the coating device has, in addition to the cathode voltage sources which are operated at the cathode/anode voltage of 500 volts with a power of up to 12 kW, two further voltage sources 6, 7 whose set voltage values have a determining effect on the desired increase in the degree of ionization of the target material. These voltage sources 6, 7 are operated at a power of up to 6 kW. All the voltage sources 4, 6 and 7 are designed to be adjustable for fine optimization of the coating process.

The voltage source 6 supplies the anodes 2 with a potential, the anode potential, which is positive relative to the wall 8 of the chamber 1. The voltage source 6 delivers a second voltage $U_{An}$, which may be between 50 volts and 250 volts. The anodes 2 are therefore positively biased by the second voltage $U_{An}$ relative to the earthed chamber wall 8.

The voltage source 7 delivers a third voltage $U_{Bi}$, the so-called bias voltage, whose plus pole is connected to the anodes 2. The minus pole of this voltage source 7 is connected to a substrate table 9 which is arranged inside the chamber 1 in such a way that a set of substrates 10 is arranged at a distance of about 40 mm from the target cathode 3, and the distance between the target cathode 3 and the anode is in the region of 250 mm.

The substrate table 9 is electrically connected to the set of substrates 10. For the coating process, it is necessary for the anode potential to be more positive than the substrate potential. The voltage source 7, which delivers a negative voltage, is therefore set in such a way that there is, on the set of substrates 10, a potential which may be up to 800 volts more negative than the potential of the anodes 2.

It is in this case possible to have both symmetrical operation of the voltage sources 6 and 7, in which the chamber wall 8 and the set of substrates 10 are at the same potential, and asymmetric operation of these two voltage sources 6, 7, in which the anode potential is more positive than the substrate potential. The chamber potential may preferably be more positive than the substrate potential, so that the target ions are drawn towards the substrate and do not recombine on the chamber wall 8. It is, however, also possible to have a chamber potential which is negative with respect to the substrate potential.

Typical potential values, relative to the earthed chamber 1 as a reference potential at 0 volts, are therefore: anodes 2 +50 volts to +250 volts, target cathodes 3 −350 volts to −750 volts, substrate table 9/substrate 10 +200 volts to −1000 volts. A condition which must in this case be met is that the substrates 10 have a more negative potential than the anodes 2, and the potential difference between the anodes 2 and the target cathodes 3 is optimized for the respective (material-dependent) coating process, in particular for sustaining the respective plasma.

In the example which is represented, with titanium/aluminium mixed targets 5a, 5b, for asymmetric operation of the voltage sources 6 and 7, the anode potential is +180 volts, the substrate potential is −20 volts, the chamber potential is 0 volts and the cathode potential is −320 volts.

The set of substrates 10 is arranged inside the plasma cloud formed between the target cathodes 3 and the anodes 2. This plasma cloud is characterized by a potential which, on account of the applied voltages $U_X$, $U_{An}$ and $U_{Bi}$, is at a value of about +130 volts relative to the substrates 10. This potential of the plasma cloud must generally have a value such that the target material ions are transported from the plasma (P) for deposition to the set of substrates 10.

In the illustrative embodiment which is represented, with four target cathodes 3 end two anodes 2 and the voltage $U_{Bi}$ in the region of 0 volt to 130 volts, for a total cathode power of up to 32 kW, a bias current of up to 30 A and an anode current of up to 45 A are set up.

By virtue of the electrical connection according to the invention, a potential drop is set up inside the chamber 1 in such a way that, irrespective of the type of substrates 10, a high target material ion fraction is generated. Through the operation of the voltage sources 6 and 7, a large fraction of the charge carriers which otherwise recombine on the chamber wall 6, ions, metastable species and electrons from the plasma (P), is provided for the ionization of the target material atoms during their transport from the cathodes 3 to the substrates 10. Through the described electrical connection of the anodes 2 with the target cathodes 3, the charge carrier density before the target cathodes 3 is increased, and the sputtered target cathode material is ionized during its transport phase to the set of substrates 10. On account of the high ion fraction in the sputtered target cathode material and of the described potential profile inside the chamber 1, it is possible to produce, on the set of substrates 10, dense, compact layer structures, so-called dimpled surfaces, on jet-abraded and ground surfaces of the substrates 10, even in the case of three-dimensional substrates 10.

The layer structures consist of a material which, when reactive gases are used, result from the gas atmosphere in the chamber 1 through a chemical reaction of the target material with the reactive gas. By way of example, in the case of coating the set of substrates 10 with TiAlN, a chemical reaction takes place in the chamber 1 between the target materials titanium and aluminium and the reactive gas nitrogen.

In order to achieve maximally uniform properties for the layer structures, the substrates 10 may be revolved about up to four axes of rotation between the target cathodes 3.

Figure 2:
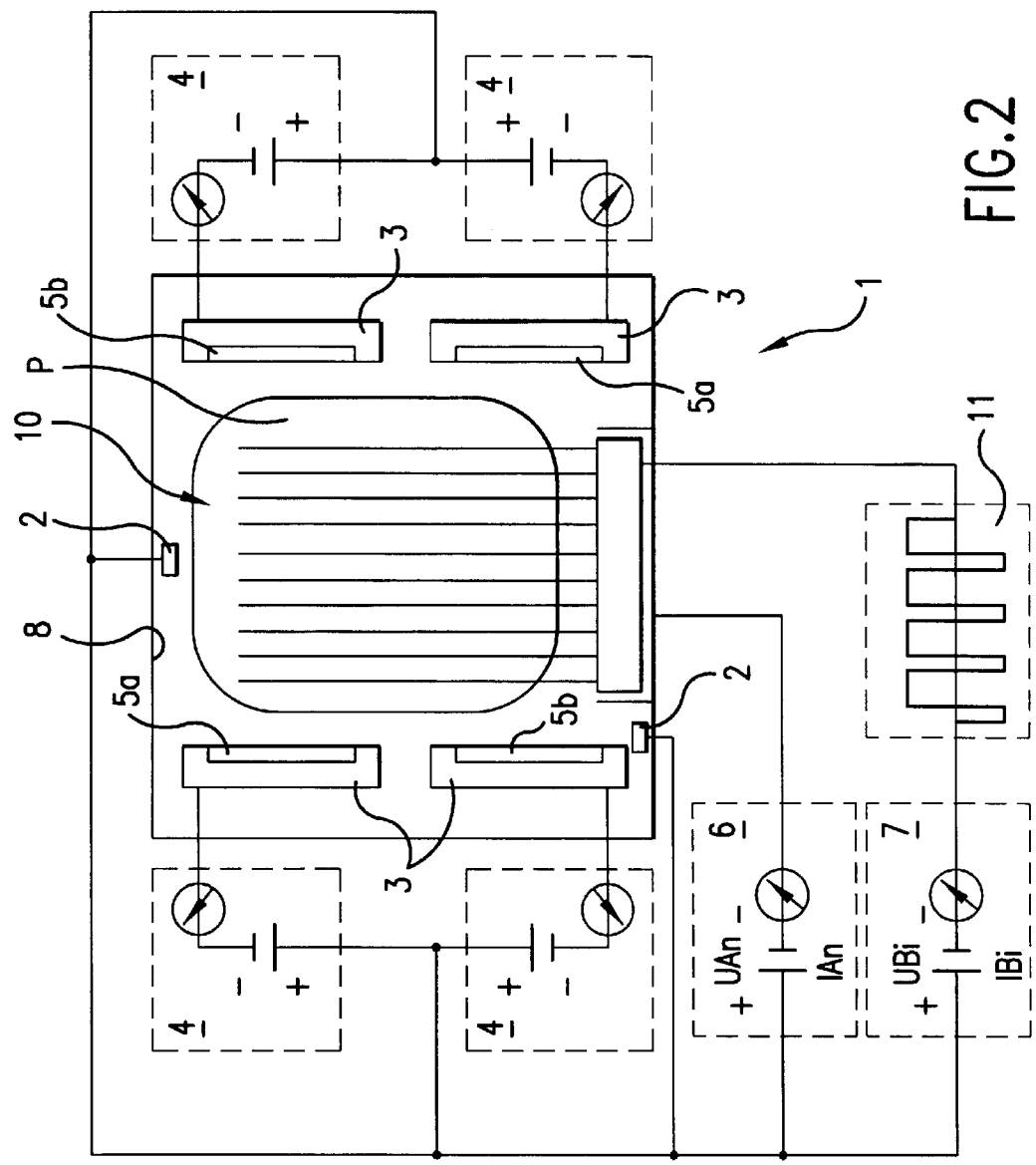
FIG. 2 shows a schematic circuit diagram of a variant of the electrical supply in FIG. 1.

FIG. 2 shows a schematic circuit diagram of a variant of the electrical supply in FIG. 1.

In comparison with FIG. 1, FIG. 2 additionally contains a pulse device 11 which is connected between the voltage source 7 and the substrate table 9. The pulse device 11 is, for example, set in such a way that a maximum bias voltage of 350 volts is applied to the substrate table 9, the average potential difference between the substrate table 9 and the plasma (P) being, as in the example in FIG. 1, about 130 volts.

Through provision of the pulse device 11, it is possible with high average ion currents for edges of the substrates 10 to be coated well, by countering the known resputtering effect which can prevent edge coating.

For the remainder, the structure in FIG. 2 does not differ from the structure according to FIG. 1. In particular, the anode potential $U_{An}$ also remains the same.

A further alternative embodiment of the PVD coating device (not shown) with the pulse device 11 is configured in such a way that the potential of the anodes 2 is pulsed. In this case, the pulse device 11 is connected, while maintaining the electrical connections according to FIG. 1, between the voltage source 6 and the anodes 2. On the set of substrates 10, there is then an offset potential with a value as chosen according to the description of the electrical connection in FIG. 1 for the voltage $U_{Bi}$.

Figure 3:
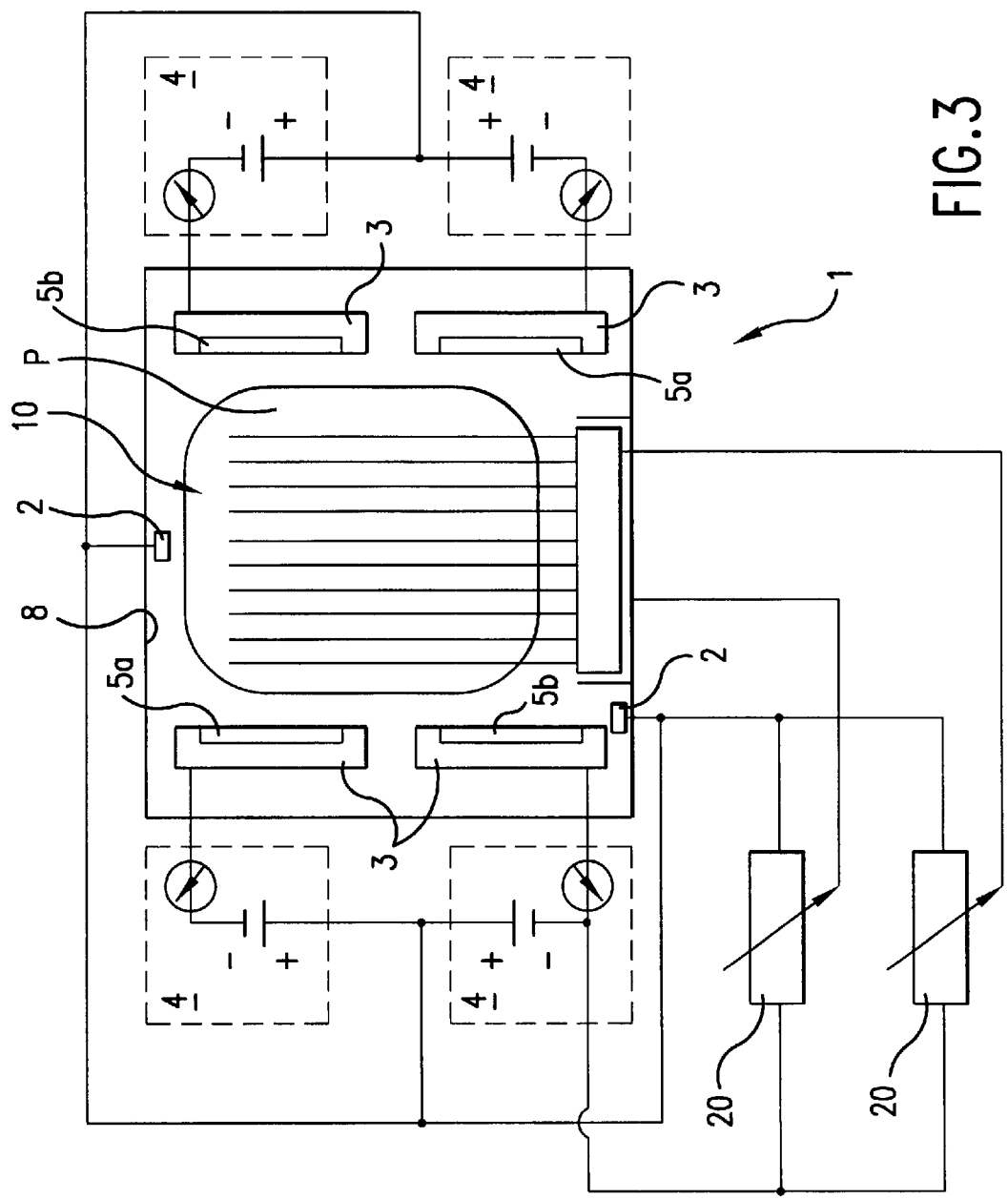
FIG. 3 shows another schematic circuit diagram of an electrical supply of a PVD coating device including variable resistors.

In an additional alternative embodiment, illustrated in FIG. 3, the voltage source 4 delivers the first voltage between the anode 2 and the target cathode 3. Respective variable resistors 20 deliver the above-mentioned second and third voltages. The variable resistors 20 are connected in parallel with the voltage source 4. The variable resistors 20 are set so that the required potentials for the anode 2 and the substrate 10 are present on their respective taps.

In both embodiments with a pulse device, the frequency for the pulsed operation is in the region of 0.5 Hz to 1 MHz, preferably 0.1 to 10 Hz.

As a supplement to the hitherto described embodiments, arc evaporators, low-voltage arcs, hollow cathodes, ion sources or the like may be used as evaporators or ion sources in the PVD coating device for further increasing the degree of ionization (hybrid methods).

With each of the embodiments described above for the PVD coating device, it is possible to carry out a PVD coating method having the following steps:

arranging at least one target cathode, which is exposed to a sputtering process, at least one anode and the substrate, which is arranged on a substrate holder which is electrically connected to the substrate, in an evacuable chamber;

filling the chamber with a working gas and/or a reactive gas through at least one gas feed connection;

applying a first voltage in order to supply the target cathode with a negative electrical potential relative to the anode in order to form a plasma in which the substrate is arranged;

applying a second voltage in order to supply the anode with a positive electrical potential with respect to the chamber wall;

applying a third voltage which supplies the substrate with an electrical potential more negative than that of the anode; and removing the substrate from the chamber after a predetermined coating time.

This method is used for producing coated substrates with prominent layer properties (dimpled surfaces). The coating process lasts about 8 hours. With 8 mm bores for the substrate materials it is possible to coat up to 860 pieces at the same time.

What is claimed is:

1. PVD coating device comprising an evacuable chamber, at least one gas feed connection, at least one target cathode, which is exposed to a sputtering process, at least one anode, and at least one substrate holder which is intended to hold at least one substrate and is electrically connected to each held substrate, a control device which has a first voltage output connected between the at least one target cathode and the at least one anode to deliver a first voltage in order to supply the at least one target cathode with a negative electrical potential relative to the at least one anode in order to form a plasma in which the at least one substrate is arranged, a second voltage output connected between the at least one anode and a chamber wall to deliver a second voltage in order to supply the at least one anode with a positive electrical potential relative to the chamber wall, and a third voltage output including a first pole connected to the at least one substrate and a second pole connected to the at least one anode to deliver a third voltage which supplies the at least one substrate with an electrical potential that is more negative than the potential of the at least one anode, and wherein the anode connections of each of the voltage outputs are points of equal potential.

2. PVD coating device according to claim 1, wherein the third voltage output supplies the at least one substrate with an electrical potential that is more positive than the potential of the at least one target cathode.

3. PVD coating device according to claim 2, wherein the control device has a voltage source which delivers the first voltage, and a pair of variable resistors which respectively control the second and third voltages, said resistors are connected in parallel with the voltage source.

4. PVD coating device according to claim 1, wherein a ratio between a distance between the at least one target cathode and the at least one substrate and a distance between the at least one target cathode and the at least one anode is about 1:5.

5. PVD coating device according to claim 4, wherein the at least one substrate holder is arranged such that the at least one substrate is arranged at a distance of substantially 40 mm from the at least one target cathode, and the distance between the at least one target cathode and the at least one anode is substantially 250 mm.

6. PVD coating device according to claim, 1 wherein the control device has a separate voltage source assigned to each of the three voltages.

7. PVD coating device according to claim 1, wherein the control device has a voltage source which delivers the first voltage, and a pair of variable resistors which respectively control the second and third voltages, said resistors are connected in parallel with the voltage source.

* * * * *